United States Patent [19]

Eaton, Jr. et al.

[11] Patent Number: 4,853,893
[45] Date of Patent: Aug. 1, 1989

[54] DATA STORAGE DEVICE AND METHOD OF USING A FERROELECTRIC CAPACITANCE DIVIDER

[75] Inventors: S. Sheffield Eaton, Jr.; Michael Parris, both of Colorado Springs, Colo.

[73] Assignee: Ramtron Corporation, Colorado Springs, Colo.

[21] Appl. No.: 69,389

[22] Filed: Jul. 2, 1987

[51] Int. Cl.[4] .................. G11C 11/22; G11C 11/24; G11C 7/00
[52] U.S. Cl. ..................................... 365/145; 365/149
[58] Field of Search .............. 365/145, 149, 109, 117, 365/228–229, 184, 185, 154, 156

[56] References Cited

U.S. PATENT DOCUMENTS

| | | | |
|---|---|---|---|
| 3,094,686 | 6/1963 | Hoffman | 340/173.2 |
| 3,393,346 | 7/1968 | Lechner et al. | 365/109 |
| 3,401,378 | 9/1968 | Bartlett et al. | 365/145 |
| 3,569,795 | 3/1971 | Gilkow | 317/321 |
| 3,681,765 | 8/1972 | Chapman | 365/109 |
| 4,021,788 | 5/1977 | Marr | 365/149 |
| 4,161,038 | 7/1979 | Wu | 365/145 X |
| 4,164,751 | 8/1979 | Tasch, Jr. | 365/149 |
| 4,391,901 | 7/1983 | Land et al. | 365/117 |
| 4,408,305 | 10/1983 | Guterman et al. | 365/185 |
| 4,432,072 | 2/1984 | Chao et al. | 365/185 |
| 4,536,785 | 8/1985 | Gibbons | 357/54 |
| 4,683,554 | 7/1987 | Lockwood et al. | 365/185 X |
| 4,703,456 | 10/1987 | Arakawa | 365/185 X |

FOREIGN PATENT DOCUMENTS 0178982 4/1962 Sweden .................. 365/145

OTHER PUBLICATIONS

IBM Tech. Discl. Bull., vol. 11, No. 5, Oct. 68, p. 474, "Ferroelectric Material", by J. D. Michaelsen.
Bell Lab. Record, Sep. 1955, pp. 345–348, "Ferroelectric Storage Devices", by W. J. Merz et al.
IEEE Transaction on Computers, vol. C-22, No. 2, Feb. 1973, pp. 154–158, "An Expandable Ferroelectric RAM" by Kaufman.
AF Avionics Lab., RTD Tech. Doc. Report N. RTD-TDR-63-4002, pp. 1–43, "Ferroelectric Phenomena in Computer Devices" by Pulvari, Oct. 1963.
Burfoot & Taylor, *Polar Dielectrics and their Applications (1979)*, pp. 291–295.

Primary Examiner—Stuart N. Hecker
Assistant Examiner—Alfonso Garcia
Attorney, Agent, or Firm—Edward D. Manzo

[57] ABSTRACT

A transpolarizer is employed as a programmable capacitance divider. Two ferroelectric capacitors are coupled in series to form a common node and two extreme poles. The polarization of the two capacitors is set by grounding the two poles and then bringing them both up to VCC while impressing a voltage at the common node corresponding to data to be stored. Later, while one pole is held at VSS, the other pole is pulsed from VSS to VCC with the common node floating. A voltage develops at the common node which is above or below the midpoint between VSS and VCC, and will be indicative of the stored data. The capacitance divider is programmed in accordance with data. One such divider is added to a DRAM memory cell to form a shadow DRAM cell. Two such dividers are added to a static RAM memory cell to form a shadow static RAM cell. The same divider arrangement is operable in both volatile and non-volatile modes. An improvement arises by using PZT as dielectric in 54:46 mole ratio.

20 Claims, 2 Drawing Sheets

DATA STORAGE DEVICE AND METHOD OF USING A FERROELECTRIC CAPACITANCE DIVIDER

FIELD OF THE INVENTION

The present invention relates to capacitor circuits and particularly their application to memory circuitry.

BACKGROUND OF THE INVENTION

The present invention in one of its aspects relates to capacitance circuits and particularly to ferroelectric capacitors. Ferroelectric capacitors and uses thereof in memory circuitry are described in U.S. patent application Ser. No. 069,390, filed July 2, 1987, copending herewith in the name of Klaus Dimmler and S. Sheffield Eaton, Jr. (one of the inventors hereof), entitled "Ferroelectric Shadow RAM," filed simultaneously herewith the entire disclosure of which is hereby incorporated by reference, and in several issued U.S. patents such as Rohrer U.S. Pat. No. 3,728,694 for "Thin Film Ferroelectric Device" and Rohrer U.S. Pat. No. 3,939,292 for "Process For Stable Phase III Potassium Nitrate And Articles Prepared Therefrom."

A certain combination of two ferroelectric capacitors having a common node has been referred to as a "transcharger" or a "transpolarizer" in *Polar Dielectrics* by Burfoot and Taylor, pp. 291-93 (1979). This text indicates such transchargers as having a "blocked" state and an "unblocked" state. No specific mention is made in this reference of using such a configuration as a capacitance divider or of combining it with other circuit elements to form a memory cell, although it is reported that transchargers had been used to form "an associative memory."

An object of this invention is to employ an arrangement of ferroelectric capacitors as a capacitance divider useful in memory applications and elsewhere.

Another object of the present invention is to devise ferroelectric memory cells wherein decay of the ferroelectric properties is self-compensated.

A further object is to provide an improved "shadow" RAM over the circuit described in the above-referenced Ferroelectric Shadow RAM patent application.

A specific object of this invention is also to provide a shadow dynamic RAM cell.

Still another object of this invention is to provide an improved dynamic RAM cell capable of use in both volatile and non-volatile modes.

SUMMARY OF THE INVENTION

According to a first aspect of the present invention, a circuit element is formed by coupling two ferroelectric capacitors, which preferably but not necessarily are substantially identical in physical construction and size, in series. Three accessible points result: two outside points referred to herein as "poles" and a common node between the capacitors. That is, the common node is electrically coupled to both capacitors, while the poles are coupled to only one capacitor each. This circuit is referred to herein as a programmable capacitance divider. The ferroelectric states of the two capacitors are set so that dipoles therein are oriented essentially uniformly with respect to the common node. Subsequently a voltage pulse is placed along one of the poles while the other pole is fixed at a reference voltage, such as ground, while the common node is permitted to float. A voltage develops at the common node which indicates the prior polarization of the ferroelectric materials in the divider.

According to another of the present invention, this circuit element is used in an otherwise volatile memory cell to form a non-volatile portion, referred to as a "shadow" portion. In one embodiment, a static RAM cell formed by a CMOS flip-flop has two nodes. Each node is coupled to a respective common node of a series arrangement of ferroelectric capacitors as described supra. Preferably, the volatile static RAM cell internal nodes are coupled by the source-drain paths of corresponding access transistors to such common nodes. To store information from the volatile cell into the ferroelectric circuits, the access transistors are turned on and the ferroelectric capacitors are all written into stable polarization states determined by the data content in the volatile cell. Power may then be removed from the circuit, but the ferroelectric states will remain in accordance with the hysteresis property of ferroelectric materials. Thereafter, the capacitor dividers can be pulsed at similar poles. As described above, this causes voltages to be developed at each common node. Because the two voltage dividers will have been previously programmed in complementary states, when voltage pulses are applied to similar poles, there will be a difference between the resulting common node voltages. This difference will be sensed by the flip-flop portion of the volatile cell and restore the data thereto.

Another aspect of the present invention relates to the combining of the invented programmable capacitance divider with an otherwise volatile dynamic RAM cell, thereby forming a nonvolatile portion. The dynamic RAM cell may comprise a single transistor, single capacitor cell, or any other dynamic RAM cell. The nonvolatile portion combines a programmable capacitance divider as described above via a coupling transistor, the source-drain path of which couples the plate of the dynamic RAM capacitor to the common node of the programmable capacitance divider. The DRAM cell is read so that the voltage impressed on the bit line from reading the cell becomes available to program the divider. While the dynamic RAM cell is being read, the coupling transistor to the ferroelectric circuit is turned on. Its two poles are coupled to receive a voltage pulse starting at zero volts which rises thereafter to five volts. If the data in the DRAM cell corresponded to a high voltage stored on the memory cell capacitor, then when the coupling transistor is turned on, the high voltage from the volatile portion of the DRAM cell is applied to the common node of the capacitance divider. When the other two poles of the divider are at zero volts, both ferroelectric capacitors will be written into a polarization state determined by that set of conditions. When the voltage rises, to five volts, for example, on the other poles of the divider, no polarization change occurs because equal voltages are applied across the ferroelectric capacitors. If, on the other hand, the voltage in the dynamic RAM cell was low, such as zero volts, then zero volts will be applied from the volatile part of the DRAM cell to the common node of the divider. When the zero volts signal is applied to the two poles of the divider, no polarization occurs because zero volts is across each of the two ferroelectric capacitors. However, when the voltage pulse on the other two poles rises to five volts, both ferroelectric capacitors are written into a state corresponding thereto. At this point the data is stored in the nonvolatile ferroelectric capacitor circuit, and power can be removed from the DRAM cell without losing data. To restore the data to the DRAM cell from the divider portion, with the coupling transistor to the ferroelectric capacitors turned off, one of the poles is grounded and the other one is pulsed from zero volts to a high voltage such as +5 volts. As described above, the voltage at the common node will be lower than the midpoint voltage if one logic state was programmed previously, but higher than the midpoint voltage for the other state. At this time, the coupling transistor is turned on so that this voltage at the common node is transferred to the DRAM cell. Then the coupling transistor preferably is turned off and the DRAM cell is read in the customary fashion.

According to another aspect of this invention, the programmable capacitance divider is employed as the memory element of a memory cell. That is, it is not a "shadow" portion but instead is the primary memory apparatus. Such structure operates, at separate times, in the volatile and non-volatile modes.

Yet another aspect of the present invention is to provide a small area, high capacity memory cell by using PZT as a dielectric material.

BRIEF DESCRIPTION OF THE DRAWINGS

A further appreciation of the several aspects of the present invention will be gained by considering the following detailed description of preferred embodiments in conjunction with accompanying drawings wherein.

DESCRIPTION OF PREFERRED EMBODIMENT

Figure 1:
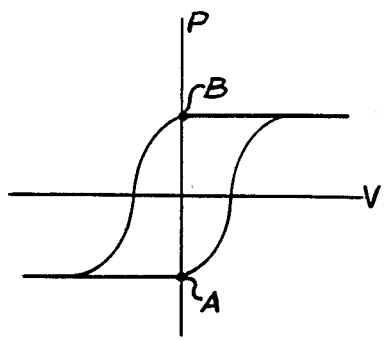
FIG. 1 is a sketch representative of a hysteresis loop exhibited by ferroelectric materials.

FIG. 1 illustrates a hysteresis curve of the type commonly associated with ferroelectric materials. The X axis, or abscissa, may represent voltage applied across the ferroelectric material, and the Y axis, or ordinate, may represent the resulting polarization. It will be seen that two stable states, A and B, exist even when no voltage is applied across the ferroelectric material. This is because the prior history of the voltage applied across the ferroelectric material determines the stable state A or B which results when voltage is removed. For example, if a material begins at state A and a positive voltage is applied across it, the polarization will increase up to a position not appreciably higher than the Y component of point B. If the voltage is then removed, the polarization remains at point B. A ferroelectric capacitor uses a ferroelectric material as the dielectic between the capacitor plates. U.S. Pat. No. 3,728,694 illustrates the use of ferroelectric materials in devices such as capacitors. U.S. Ser. No. 069,390, "Ferroelectric Shadow RAM," referenced more fully above, shows the use of ferroelectric capacitors to a volatile static RAM cell. The ferroelectric material may comprise lead zirconate titanate or other compounds or mixtures or the like which exhibit ferroelectric properties.

Figure 2A:
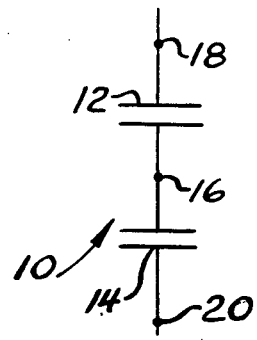
FIG. 2A represents schematically a pair of capacitors in series.
Figure 2B:
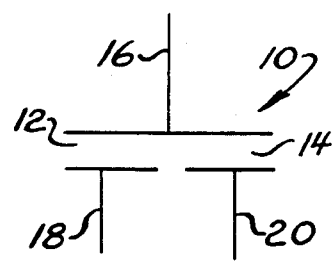
FIGS. 2B and 2C illustrate the same circuit arrangement of FIG. 2A, but is redrawn to show the three connection points more clearly.

FIG. 2A schematically illustrates a divider 10 formed by two capacitors 12, 14 connected in series. This arrangement has a common node 16 between capacitors 12, 14, and poles 18, 20 each corresponding uniquely to only one respective capacitor. FIG. 2B illustrates the same arrangement, but is redrawn in slightly different schematic form to have three leads for the three access points of the divider. It is helpful to refer to the divider in the schematic form shown in FIG. 2B.

If capacitors 12, 14 are normal, nonferroelectric capacitors, and a voltage Vx is impressed between terminals 18, 20, then the capacitors operate as a voltage divider so that if the capacitors have equal capacity, the voltage at node 16 will have the value of 0.5Vx. If the capacitances 12, 14 are unequal, then the voltage V16 at 20 is defined by the following equation:

$$V16 = Vx[C12/(C12+C14)]$$

where C12 represents the capacitance of capacitor 12, and C14 represents the capacitance of capacitor 14.

Figure 2C:
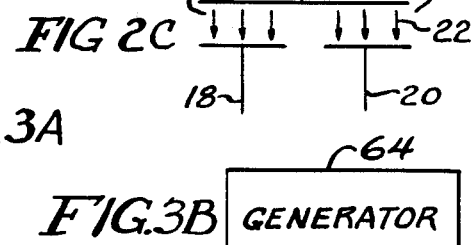

According to the preferred embodiment of this invention, capacitors 12 and 14 are both ferroelectric capacitors. The polarization of this arrangement will now be considered, referring more particularly to FIG. 2C. If poles 18 and 20 are both tied to zero volts and +5 volts is applied to common node 16, then the ferroelectric material in capacitors 12, 14 will become polarized in the same direction relative to node 16. In FIG. 2C, arrows 22 indicate the polarization in a "down" direction with respect to node 16, and this direction will represent one logic state. Clearly, another logic state can be obtained by changing the voltages so that common node 16 is at zero volts and poles 18, 20 are plus five volts; under such conditions the polarization will be such that arrows 22 will point toward node 16, i.e., they will be "up" and represent the other logic state.

Assume that the polarization has been arranged to be down as depicted in FIG. 2C. If pole 18 is now held at ground, common node 16 permitted to float, and a voltage transition from ground to plus five volts applied to pole 20, then a voltage will be developed at node 16. However, this voltage will not be 2.5 volts, but will depend on the effective capacitance of capacitors 12, 14, which, as mentioned, are physically identical but are ferroelectric in nature. When the plus five volts is applied, the voltage at node 16 tends to rise, and the dipoles in the ferroelectric material in capacitor 14 want to change their polarization state. As the voltage at node 16 rises, dipoles in capacitor 12 experience no tendency to change polarization direction because pole 18 is at ground and node 16 is positive. Capacitor 14 therefore exhibits high capacitance because the dipoles want to change polarization, whereas capacitor 12 exhibits low capacitance because its dipoles tend not to change polarization as the result of the applied voltage pulse. Consulting the aforementioned equation, it can be seen that the voltage developed at the common will be higher than 2.5 volts in the condition where the capacitors 12, 14 were both polarized "up" as shown in FIG. 2C. It will similarly be understood that if the capacitors 12, 14 are both polarized "down," then when a voltage pulse from zero to plus five volts is applied to pole 20 while pole 18 is grounded and node 16 floats, a voltage will develop at node 16 which is below 2.5 volts.

It will therefore be appreciated that the process of setting the polarization of capacitors 12 and 14 both in an "up" direction or a "down" direction effectively programs the capacitance divider 10. That is, upon subsequent application of a pulse, a voltage will be developed at the common node 16 which will be dependent on the direction of polarization of the ferroelectric materials. The common node voltage will be either greater than or less than one-half of the voltage transition in the applied pulse.

Figure 3A:
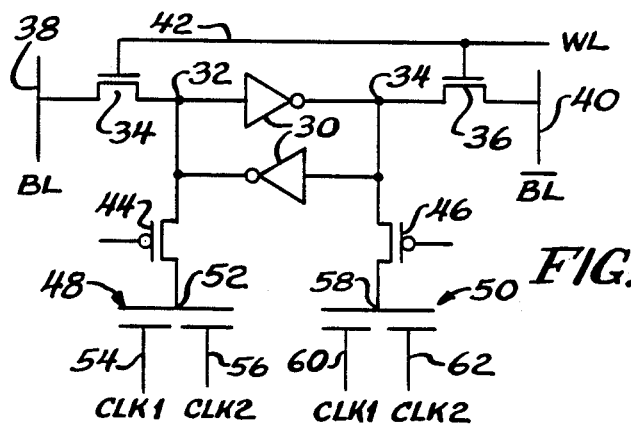
FIGS. 3A and 3B show how the programmable capacitance divider of the present invention is applied to form a "shadow" static RAM cell.

This programmable capacitance divider can be applied in memory circuits. FIG. 3A illustrates a static RAM cell having volatile and nonvolatile portions, the nonvolatile portion including a programmable capacitance divider as shown in FIG. 2B. FIG. 3A illustrates a full CMOS static RAM cell of the sort using cross-coupled transistors symbolized by circuits 30 which are located between or define two internal nodes 32, 34. Nodes 32, 34 are conventionally coupled via the source-drain paths of access transistors 34, 36 to a complementary pair of bit lines 38, 40. The gate electrodes of access transistors 34, 36 are both coupled to a word line 42 which is also coupled to adjacent memory cells in the same fashion. The portion of the memory cell of FIG. 3 as described so far is identical to the memory cell described and illustrated in co-pending U.S. Ser. No. 069,390, incorporated herein by reference. This portion of the static RAM cell is volatile in that if power is removed from circuits 30, the data will be lost. In co-pending Ser. No. 069,390, transistors such as coupling transistors 44, 46 couple each internal node, such as 32, 34, to a respective single ferroelectric capacitor. The memory cell of FIG. 3A, however, couples internal nodes 32, 34 to respective programmable capacitance dividers 48, 50. Divider 48 includes a common node 52 and poles 54, 56. Divider 50 includes a common node 58 together with poles 60, 62.

A detailed discussion of the manner of storing information in a "shadow" portion of a static RAM cell using a ferroelectric capacitor as the "shadow" cell portion is shown in copending Ser. No. 069,390. Briefly, however, the volatile static RAM cell portion creates voltages at nodes 30, 32. Illustratively, the voltages at the internal nodes 32, 34 of the static RAM will be zero volts (VSS) and +5 volts (VCC). Coupling transistors 44, 46 are selectively activated whenever the information from the volatile part of the cell is to be written or restored into the non-volatile portion of the cell. This polarizes the ferroelectric capacitors.

In the operation of the FIG. 3A circuit, when coupling transistors 44, 46 turn on, poles 54, 56, 60, and 62 are grounded so that whichever node 32 or 34 has the high voltage level will polarize the ferroelectric material in its corresponding divider 48 r 50 in the direction shown in FIG. 2C (because there will be a voltage across both capacitors of the divider). The internal node 32 or 34 which has zero volts will not result in polarization of its corresponding divider 48 or 50 at this time (because all plates of the divider have zero volts on them). However, after poles 54, 56, 60, and 62 are coupled to a zero voltage level and one divider becomes polarized, a full VCC level is applied to all poles. The result is that whichever divider 48 or 50 has already been programmed in the "down" direction will not change polarization (because it will have +5 volts at all three of its terminals). However, the other divider will now become polarized in the "up" direction because the internal node from the volatile portion of the cell will couple zero volts to the common node, and the poles of the divider will have the full VCC level impressed thereon. This causes polarization in the "up" direction. At this time, dividers 48 and 50 are programmed in accordance with the data stored in the volatile portion of the SRAM memory cell, and power may be removed from the memory cell safely. Although the voltages will disappear from dividers 48 and 50, the polarizations will remain intact notwithstanding the loss of power.

To restore data from the non-volatile portion to the volatile portion, the following steps occur. Poles 54 and 60 are grounded, and poles 56 and 62 each are brought high (i.e., to VCC). As explained with reference to FIG. 2B, each capacitance divider 48, 50 will develop a respective voltage at its common node 52, 58 in accordance with the polarization of the ferroelectric materials between the plates of the capacitors. Because the polarizations of the two dividers 48, 50 will be in opposing directions in accordance with the complementary data at internal nodes 32, 34 of the flip-flop, one of the capacitance dividers will develop a voltage greater than 2.5 volts and the other will develop a voltage below 2.5 volts, assuming that a VCC pulse of 5 volts is applied at poles 56 and 62. Coupling transistors 44, 46 can be turned on at that time, and the volatile portion of the memory cell can then be latched to sense the difference in voltage on common nodes 52, 58, driving one of the internal nodes 32, 34 to ground and the other one to VCC.

Figure 3B:
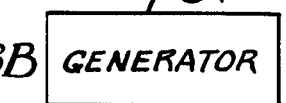

The ordinarily skilled artisan will have no difficulty in providing a signal generator to provide the appropriate clock signals for poles 54, 56, 60, and 62, and a signal generator 64 is shown in FIG. 3B providing clock signals CLK 1 and CLK 2. As shown in FIG. 3A, poles 54 and 60 each are coupled to signal CLK 1, whereas poles 56 and 62 are coupled to clock signal CLK 2. In the transfer from the volatile portion into the ferroelectric non-volatile portion, signals CLK 1 and CLK 2 have the same voltage levels at the same times and experience a transition from VSS to VCC, thereby permitting dividers 48, 50 to be polarized in complementary senses. In the operation of transferring data from the ferroelectric non-volatile portion into the volatile portion, CLK 1 and CLK 2 are independent of each other, with CLK 1 grounded and CLK 2 initially grounded but then raised to VCC.

Figure 4A:
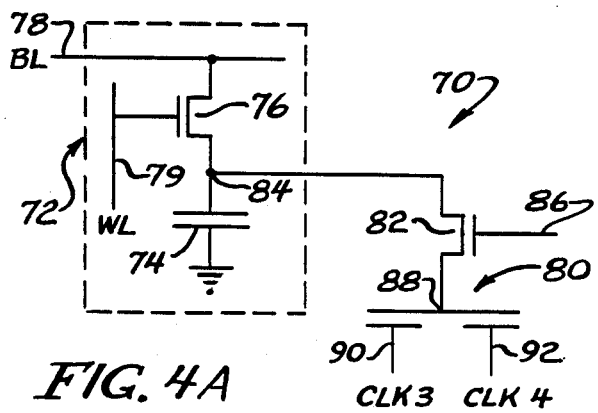
FIGS. 4A and 4B are schematic diagrams illustrating how a programmable capacitance divider of the present invention is applied to form a "shadow" dynamic RAM cell.
Figure 4B:
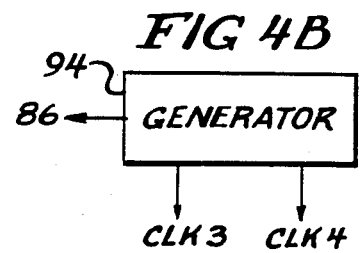

Whereas the embodiment of FIG. 3A represents an improvement over commonly-assigned, co-pending Ser. No. 069,390, FIG. 4A represents a basic non-volatile shadow dynamic RAM cell 70. A traditional DRAM memory cell 72 is included as a portion of cell 70. Portion 72 comprises a storage capacitor 74, one plate of which is usually in the substrate and grounded. The other plate is coupled through the source-drain path of an access transistor 76 to a bit line 78. The gate electrode of transistor 76 is coupled to and controlled by a word line 79. This specific example of cell portion 72 is merely illustrative: Cell portion 72 may have any construction consistent with operation as a DRAM cell.

However, in cell 70 a programmable capacitance divider 80 is coupled via the source-drain path of a coupling transistor 82 to an internal node 84 within cell portion 72. Transistor 82 includes a gate electrode coupled to and controlled by the signal on a control line 86, which may be regarded as a second word line. Divider 80 is configured and operates in accordance with divider 10 illustrated in FIG. 2B and includes a common node 88 with two poles 90, 92. Pole 90 is coupled to a logic signal CLK 3, and pole 92 is coupled to a logic signal CLK 4, both provided by a signal generator 94.

During normal operations of the volatile DRAM portion 72, transistor 82 is turned off. In the example given where transistor 82 is an N-channel device, line 86 (which is coupled to generator 94) is grounded to keep transistor 82 off. To store data in the non-volatile ferroelectric portion of circuit 70, transistor 82 is turned on by raising the voltage on line 86. This couples the common node 88 to internal node 84 of volatile cell portion 72. Because the capacitance of capacitor 74 is small, it cannot be relied upon ordinarily to transfer sufficient charge to common node 88 to achieve polarization. Accordingly, in the store to non-volatile cycle, the DRAM cell 72 is read, preferably prior to turning on transistor 82. As the result, the voltage on bit line 78 becomes available through the source-drain path of transistor 76 and is coupled to common node 88.

Clock signals CLK 3 and CLK 4 during this time have the same value. While cell portion 72 is being read and when transistor 82 is initially turned on, both CLK 3 and CLK 4 are at a ground level (VSS). The data in cell 72 to be stored in divider 80 will require the voltage at internal node 84 to be ether high or low, e.g. at VSS or VCC. If internal node 84 has a voltage at VSS level (zero volts), then zero volts is applied across the plates of the two capacitors in divider 80, and no polarization occurs. However, CLK 3 and CLK 4 thereafter are brought to VCC, and a polarization in the "up" direction (illustratively) thereupon occurs because zero volts is applied to common node 88 whereas both poles 90 and 92 have positive voltages. If, on the other hand, the voltage at internal node 84 is high, such as at VCC, then when that voltage is coupled to common node 88 by transistor 82, the two capacitors in divider 80 will be polarized in a down direction when the voltages at poles 90, 92 are low, at VSS. When CLK 3 and CLK 4 rise to VCC, the polarization will not change because substantially the same voltage will be applied to all access points 88, 90, 92. Consequently, after this voltage transition of CLK 3 and CLK 4, the divider is "programmed" by having a polarization in either the "up" or the "down" direction in accordance with the data from the volatile memory cell portion 72. Power can then be removed, and although voltages will all drop to zero throughout the memory cell, the polarization will remain due to the ferroelectric material in divider 80.

To recall or restore the data from divider 80 to volatile cell portion 72, transistor 82 is kept off and the voltage at pole 90 is kept at ground. That is, CLK 3 is at VSS. CLK 4 applied to pole 92 initially is at VSS but is brought to a full VCC level (illustratively +5 volts). As discussed with reference to FIG. 2B, a voltage develops at common node 88 depending upon the polarization state of the ferroelectric material in divider 80. The voltage will be greater than 2.5 volts for one state and lower than 2.5 volts for the other polarization state (where the applied pulse is +5 volts). At this time, transistor 82 may be turned on by bringing up the voltage on line 86. This applies the common node voltage to node 84 within cell portion 72 which is caused to execute a read cycle after transistor 82 is turned off, thereby restoring a full "1" or "0" level to node 84.

Figure 5:
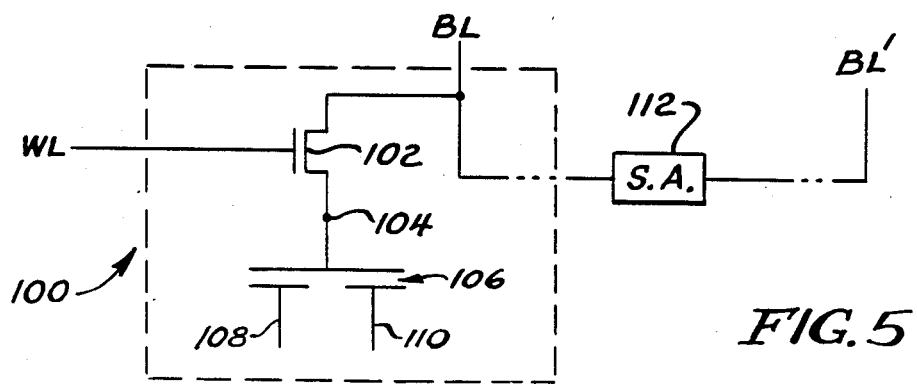
FIG. 5 shows another embodiment of the present invention using the programmable capacitance divider in a memory cell, but not as a "shadow" portion.

Another embodiment of this invention is shown in FIG. 5, which shows a memory cell 100 coupled via a transistor 102 to a bit line BL. Transistor 102 is gated by a word line WL. A common node 104 of a capacitance divider 106 as described supra also is coupled to transistor 102. Poles 108, 110 of divider 106 are shown and are coupled to receive clock signals from a signal generator, such as generator 94. The word line and bit line are as commonly used in a DRAM. The bit line must be precharged, however, to VCC/2 prior to a read operation.

To read cell 100, pole 108 is grounded, and pole 110 is brought illustratively to +5 v. As described supra, node 104 will be either greater than +2.5 v or less than +2.5 v depending on the data content of the cell, assuming the capacitance values of the two ferroelectric capacitors to be equal. The word line WL is then brought high, and the voltage on bit line BL will then be slightly greater or less than +2.5 v. This voltage can be compared at a sense amplifier 112 to the voltage on the opposite bit line BL' (which is on the other side of sense amplifier 112) whose voltage will have remained at 2.5 v, since no cell will have been connected to it. A normal DRAM read operation then occurs to sense the data.

To write data into cell 100, the operation is the same as that of the shadow DRAM cell of FIG. 4A herein. However, no second transistor is needed. The common node 104 becomes coupled to bit line BL via the source-drain path of transistor 102, and poles 108, 110 are held (by clock signals for example) to ground level, VSS. Then poles 108, 110 are brought to VCC. As described supra, the data to be stored will determine the voltage on bit line BL and therefore will determine the polarization of divider 106, i.e. "up" or "down." This programs the divider.

Figure 6:
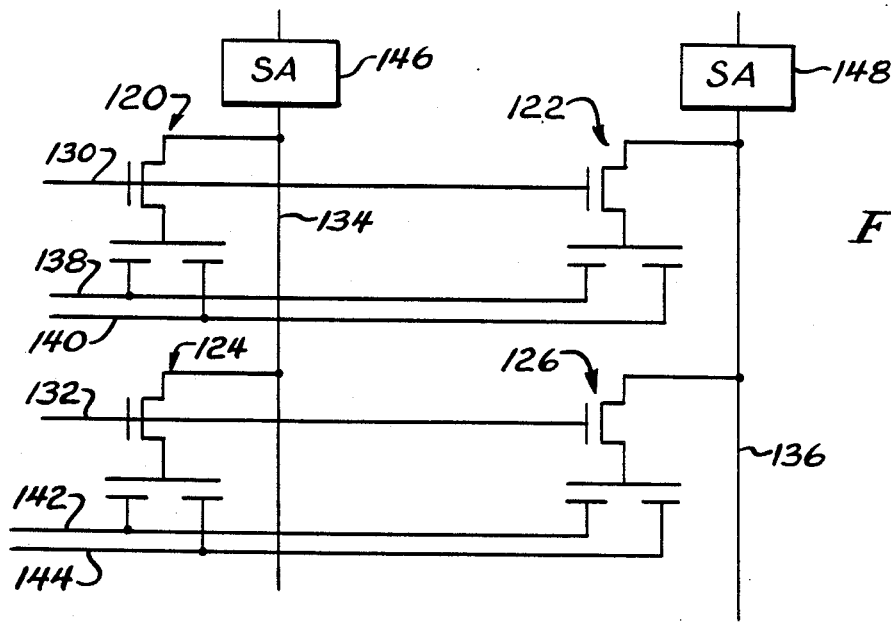
FIG. 6 shows a small array of memory cells using programmable capacitance dividers in accordance with the present invention.

FIG. 6 illustrates a simplified version of an array using the programmable capacitance divider arrangement illustrated in FIG. 5. As shown in FIG. 6, four such cells 120, 122, 124, and 126 are shown. Each cell includes a programmable capacitance divider and corresponding connections. In the array of FIG. 6, a first word line 130 is coupled to the gate electrodes of the transistors in cells 120, 122. A second word line 132 is coupled to the gate electrodes of cells 124, 126. A first bit line 134 and a second bit line 136 also are illustrated as orthogonal to word lines 130, 132. With respect to memory cells 120 and 122, a first pair of common lines 138, 140 is coupled to corresponding poles of the programmable capacitance divider in cells 120 and 122. A second pair of common lines 142, 144 is coupled to the poles of the programmable capacitance dividers of the lower portion of the array, that is memory cells 124, 126. Illustratively, the common lines are parallel to the word lines.

Figure 7:
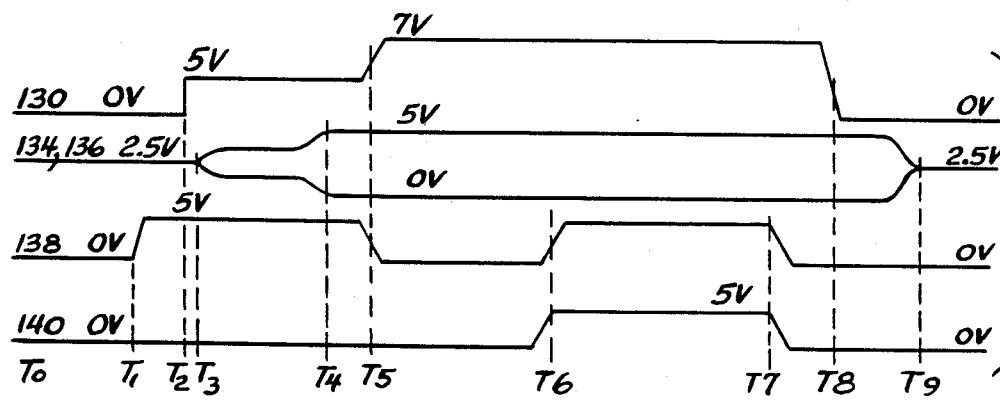
FIGS. 7 and 8 show timing diagrams for the circuit of FIG. 6.
Figure 8:
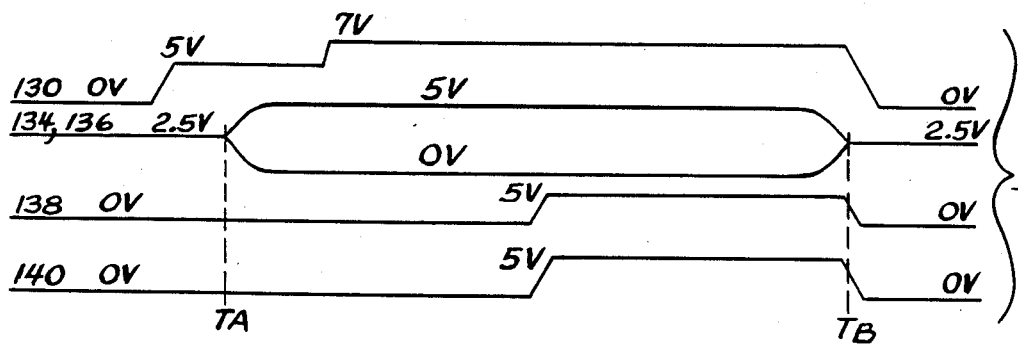

FIGS. 7 and 8 are timing diagrams to illustrate the use of this array. Referring to FIG. 7, memory cells 120, 122 will be considered. A waveform is shown therein for word line 130, as well as a waveform for either of the bit lines 134, 136. The signals on lines 138 and 140 are also shown. At a time T0, each bit line is precharged to 2.5 volts. At a time T1, line 138 is pulsed to 5 volts for the purpose of developing a signal at the common node of the chosen memory cell (120 or 122). In response, the common node voltage begins to develop, and short time thereafter at time T2, word line 130 is pulsed to +5 volts thereby coupling the common node of each programmable capacitance divider in cells 120, 122 via the source-drain paths of the corresponding transistors to bit lines 134, 136.

A short time thereafter, at time T3, the voltages on bit lines 134, 136 change from 2.5 volts, rising or falling in accordance with the data which was used to program the cells 120, 122. Thereafter, at a time T4, sense amplifiers 146, 148, coupled to bit lines 134, 136 and operating in a differential mode, using either a folded bit line structure or an open bit line structure as is well known in the memory art, latches the signals developed on each of lines 134, 136 to either VCC or VSS, illustrated in FIG. 7 as +5 volts or 0 volts respectively.

Thereafter, word line 130 is pulsed even higher to a +7 volt level for the purpose of restoring a full VCC level into the ferroelectric programmable capacitance dividers. Basically, the word line voltage is elevated more than a threshold voltage over VCC so that the full VCC level latched by the sense amp can be communicated via the source-drain path without a voltage drop to the common node of the corresponding programmable capacitance divider. Hence, at this time, the data has been latched into the sense amplifier and the restoring operation may commence. During this entire time, line 140 has been grounded.

Accordingly, it is shown in FIG. 7 that at time T5 the voltage on line 138 is dropped to ground, like line 140. Hence, all poles of the programmable capacitance dividers in cells 120, 122 are at the same voltage level. At a subsequent time T6, all pole voltages are elevated by impressing a +5 volt signal on each of lines 138, 140 until a time T7. This restores the proper state to the ferroelectric materials in the cells. At a time T8, precharging begins by dropping the word line voltage to ground, and it can be seen that at time T9 the bit line voltages are equilibriated and precharged to +2.5 volts.

FIG. 8 illustrates the voltage levels for writing into the cells. This process is virtually identical to the restore operation described supra with the sole exception being that the bit line voltage, initially at 2.5 volts, is driven by appropriate circuitry such as a "Data In" buffer and related amplifiers to either a VCC or VSS voltage illustrated in FIG. 8 as +5 volts or 0 volts, typically bypassing the sense amplifiers 146, 148. These bit line voltages endure over times TA and TB during which the voltage levels on lines 138, 140 are initially both at 0 volts and then subsequently both elevated to +5 volts, for reasons described above and extensively in the prior portion of this specification.

Figure 9:
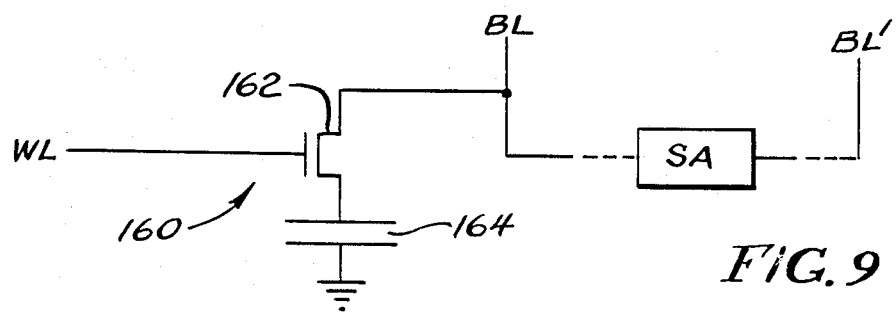
FIG. 9 a simple one-transistor memory cell for a DRAM in which PZT can be used as a dielectric to develop a dramatic improvement over current high-performance DRAM cells.

It was mentioned supra that one of the materials having ferroelectric properties is PZT. It is another aspect of the present invention to use the normal dielectric constant of this ferroelectric material in a DRAM capacitor application, without necessarily using the Ferroelectric nature for non-volatile storage. Consequently, FIG. 9 illustrates in schematic diagram form a standard configuration of a dynamic RAM memory cell of the one capacitor, one transistor type. Any other type can be used. This memory cell 160 includes a transistor 162 and a capacitor 164 which preferably uses, however, a ferroelectric material which is preferably PZT. Standard DRAM cells normally do not use ferroelectric materials. The advantage of using PZT in this application resides in the fact that its dielectric constant in on the order of 1,000 whereas the dielectric constant of silicon dioxide is approximately 4. The result of this is extremely beneficial, namely, the capacitance of device 164 increases by a factor of approximately 250 simply by substituting PZT as the dielectric. The advantage of providing such a configuration is that the objective of achieving high capacitance with a small area of silicon is achieved, and one need not resort to alternate techniques such as trench capacitors currently being developed. For example, the area of capacitor 164 customary shape to achieve a capacitance of approximately 0.05 picofarads can be on the order of one square micron or less. As shown in FIG. 9, the lower plate of capacitor 164 is grounded. An initialization routine is employed for this embodiment wherein the ferroelectric is programmed to the portion of the hysteresis curve connected to point B of FIG. 1. Thereafter, no ferroelectric reversals of polarization occur to bring the polarization down to point A of FIG. 1.

The preferred material, as mentioned, is PZT which is an ionic compound formed by lead, zirconium titanium and oxygen. Its formula is $Pb(ZrTi)O_3$. Preferably there is some variation so that some of the molecules have zirconium and no titanium, whereas others do not have zirconium but instead have titanium. Consequently, some of the molecules have the formula $PbZrO_3$ whereas others of the molecules are $PbTiO_3$. Preferably, the mole relationship between the zirconium and the titanium is in the ratio of 54 to 46, although other ratios may be useful to provide both high capacitance as well as high resistance across the capacitor plates and to minimize its piezoelectric effect. Impurities such as niobium or lanthanum can be added, but those dopants need not be included in this application.

As a further aspect of this invention, the memory cell and circuit diagram of FIG. 5 can be employed using PZT as the ferroelectric material in a standard, volatile DRAM operation, but also provides the added benefit that after normal DRAM operations are concluded (or at any other convenient time), the information can be stored in a non-volatile manner by pulsing either line 108 or 110. During normal operations, both 108 and 110 are held to ground, and the device functions exactly as described with respect to FIG. 9. Thereafter, when it is desired to store the data in a non-volatile manner, precisely the same structure can be employed with the write timing of FIG. 8. Thereafter, the programmable capacitance divider can be read using the timing of FIG. 7 to obtain the data, in cooperation with the sense amplifier 112.

In describing the various aspects of the present invention, it has been indicated that during the operation of storing data in the programmable capacitance divider, the voltages applied to the poles, such as poles 18, 20 in FIG. 2B, are tied together. In a modification of the process described herein, the two poles can operate independently.

It will be appreciated that either N-channel or P-channel transistors can be used, and either enhancement-type or depletion-type channels can be used in practicing the present invention. Indeed, any switching device can be used for selectively coupling the programmable capacitance divider to any other circuit. Consequently, switching devices which can be used are not limited to field effect transistors, and may include other types of transistors or other devices.

It has been mentioned also that in the preferred embodiment, the two capacitors placed in series have the same physical size and capacitance. Various arrangements may be made departing from this preferred sizing, although it will be understood that the resulting voltages at the common node may vary as a result of an imbalance in the capacitor sizes. However, it may prove advantageous to use unequal capacitance values in the divider for specific applications in order to control the range of voltages obtained at the common node during a recall operation.

An advantage of incorporating a programmable capacitance divider as a "shadow" portion to a memory cell is its self-tracking nature. That is to say, if there is a variation in the dielectric constant, or a degradation over time of the ferroelectric nature of the dielectric material used in the capacitance divider, the change or variation will uniformly affect both capacitors of the divider. Its operation will continue properly because the two capacitors are balanced against each other.

One advantage to the "shadow" approach is that ferroelectric materials which fatigue after a number of read/write cycles can still be used since they are written into or read typically on power-up or power-down. The volatile portion of the cell is used more frequently in such a combination. On the other hand, a ferroelectric material which fatigues after only a large number of cycles permits direct use of the "shadow" portion as shown in FIG. 5. Such ferroelectric materials may be PZT or lead zirconate titanate.

While various embodiments of the present invention have been described and illustrated, it is intended that these descriptions and illustrations be exemplary only, and that the scope of protection afforded to the present invention should not be limited by these examples. Instead, the scope of protection to be afforded is defined by the following claims.

We claim:

1. A method for non-volatile storage and retrieval of digital data using a capacitor divider formed by first and second ferroelectric capacitors, with a first common node between them and first and second poles corresponding to the first and second capacitors, the method comprising the steps of:

storing the data, including applying a voltage representing the data to said common node, holding said poles at a first voltage while said voltage representing the data is being applied to the common node, thereby polarizing ferroelectric material in the capacitors in a direction to correspond to the data; and retrieving the data, including maintaining said first pole at said first voltage while applying a voltage transition to said second pole, and sensing the voltage developed on said common node, said developed voltage being indicative of said digital data.

2. The method according to claim 1 wherein said applying step comprises coupling an internal node of a volatile memory cell to said common node.

3. The method according to claim 1 wherein said step of applying a voltage transition to said second pole comprises controlling the voltage on said second pole so that it initially is at said first voltage and thereafter transitions to another level.

4. The method according to claim 3 wherein said step of applying a voltage transition comprises maintaining said first at second poles at ground and then impressing a different voltage on said second pole while said first pole is still at ground.

5. The method according to claim 1 wherein said step of applying a voltage comprises applying an operating voltage or ground level to said common node of said two capacitors and said storing step further comprises controlling the voltage at said first and second poles of said capacitors to change between ground and operating level while said voltage representing the data is applied to said common node.

6. The method according to claim 5 wherein the voltages are applied to said poles together during said storing operation.

7. The method of claim 1 wherein said storing step further comprises applying a second voltage to said poles while said data-representing voltage is being applied to said common node, so that said capacitors will become polarized regardless of whether the digital data is a binary one or a binary zero.

8. The method according to claim 7 wherein the storing step further comprises storing complementary data by polarizing a second pair of ferroelectric capacitors coupled in series, said second pair of capacitors having a second common node and two further poles, said polarizing of said second pair of capacitors being in the opposite direction than the polarization of said first pair of capacitors, and wherein said step of retrieving the data comprises generating further voltages at said first and second common nodes; and wherein said sensing step comprises sensing the difference between the voltages at said two common nodes.

9. The method of claim 8 wherein said storing step comprises holding each pole of said first and second pairs of capacitors at ground and changing the voltage on all of said poles to said second voltage while applying voltages representing complementary data to said first and second common nodes.

10. The method of claim 9 wherein said generating comprises grounding both of said first poles and applying a voltage transition to said second poles together.

11. The method of claim 10 including applying the same first signals to said first poles together and the same second signals to said second poles together.

12. The method of claim 8 further including coupling said first poles together and coupling said second poles together, and wherein said storing step comprises coupling said first and second poles to ground and then to an operating voltage, and wherein said generating step includes coupling said first poles to ground and applying a voltage transition to said second poles.

13. The method according to claim 7 wherein said voltage applied to said common node during said storage step is either at ground or an operating level, and wherein said first and second voltages comprise ground and an operating voltage.

14. A method for non-volatile storage and retrieval of digital data comprising the steps of:

storing the digital data by coupling a voltage representing digital data to be stored to a common node of a pair of series-coupled ferroelectric capacitors while maintaining the voltages at poles of said pair at a first level and then a second level thereby to polarize both of said capacitors in a direction corresponding to the digital data; and retrieving the digital data by applying a voltage transition between ground level and an operating voltage level to one of the poles while maintaining constant the voltage at the other of the poles and while allowing the voltage on said common node to float, thereby to develop a voltage at the common node, and sensing the voltage developed on the common node to identify the stored digital data.

15. A non-volatile method of reading and writing digital data comprising steps of:
   writing the digital data by polarizing a first pair of ferroelectric capacitors coupled in series, said capacitors having a common node and two poles, the polarization direction corresponding to the data; thereafter
   reading the data by developing a voltage at said common node by applying a voltage transition to only one of said poles; and thereafter sensing said voltage at said common node.

16. The method according to claim 15 wherein said step of developing a voltage at said common node comprises changing the polarization of only one of said ferroelectric capacitors.

17. The method according to claim 15 wherein said step of polarizing includes applying a voltage representing the data to said common node while applying a first voltage corresponding to one data state to said two poles together and then applying a second voltage corresponding to the other state to said two poles together.

18. The method according to claim 17 wherein said reading step includes changing the polarization of only one of said ferroelectric capacitors.

19. The method according to claim 18 wherein said step of changing the polarization comprises controlling the voltage on one of said poles to be constant while providing said voltage transition on the other of said poles.

20. The method according to claim 15 wherein said polarizing step comprises coupling a voltage from an internal node of a dynamic RAM memory cell to said first common node, and said sensing step comprises coupling said first common node to said DRAM cell and reading said DRAM cell.

* * * * *